US007222661B2

(12) United States Patent
Wei et al.

(10) Patent No.: US 7,222,661 B2
(45) Date of Patent: May 29, 2007

(54) COOLING MODULE

(75) Inventors: Jie Wei, Kawasaki (JP); Masahiro Suzuki, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 10/990,653

(22) Filed: Nov. 18, 2004

(65) Prior Publication Data
US 2006/0005945 A1    Jan. 12, 2006

(30) Foreign Application Priority Data
Jul. 8, 2004     (JP)     ............... 2004-201721

(51) Int. Cl.
H05K 7/20     (2006.01)
(52) U.S. Cl. ............... 165/80.4; 165/104.33; 361/699
(58) Field of Classification Search ........... 165/104.14, 165/104.28, 104.31, 104.33; 361/697, 699
See application file for complete search history.

(56) References Cited

U.S. PATENT DOCUMENTS

| | | | | |
|---|---|---|---|---|
| 5,316,077 | A * | 5/1994 | Reichard | ............... 165/104.28 |
| 5,901,037 | A * | 5/1999 | Hamilton et al. | ........... 361/699 |
| 6,019,165 | A * | 2/2000 | Batchelder | ................ 165/80.3 |
| 6,263,957 | B1 * | 7/2001 | Chen et al. | ................. 165/80.4 |
| 6,377,458 | B1 | 4/2002 | Morris et al. | |
| 6,648,064 | B1 * | 11/2003 | Hanson | ..................... 165/120 |
| 6,957,692 | B1 * | 10/2005 | Win-Haw et al. | ...... 165/104.33 |
| 2002/0075650 | A1 | 6/2002 | Morris et al. | |
| 2002/0162647 | A1 * | 11/2002 | Wagner | ...................... 165/121 |
| 2003/0063438 | A1 | 4/2003 | Morris et al. | |
| 2003/0121645 | A1 * | 7/2003 | Wang | .................... 165/104.26 |
| 2004/0140084 | A1 * | 7/2004 | Lee et al. | ............. 165/104.11 |
| 2005/0103475 | A1 * | 5/2005 | Lee et al. | ............. 165/104.33 |
| 2005/0168939 | A1 * | 8/2005 | Iijima et al. | ................ 361/687 |
| 2005/0183848 | A1 * | 8/2005 | Cheng et al. | .......... 165/104.33 |

FOREIGN PATENT DOCUMENTS

| | | |
|---|---|---|
| JP | 8-32263 | 2/1996 |
| JP | 3068892 | 3/2000 |
| JP | 2002-130887 | 5/2002 |
| JP | 2002-368471 | 12/2002 |

* cited by examiner

Primary Examiner—Allen J. Flanigan
(74) Attorney, Agent, or Firm—Armstrong, Kratz, Quintos, Hanson & Brooks LLP

(57) ABSTRACT

A cooling module includes a thermal conductive member. An endoergic chamber, a radiative chamber and a circulation pump chamber are defined along the thermal conductive member. The thermal conductive member contacts a heat generating object outside the endoergic chamber. The thermal energy is transferred to the coolant in the endoergic chamber. The coolant then flows into the radiative chamber. The thermal energy of the coolant is taken away in the radiative chamber. The thermal energy is radiated from the outer wall surface of the radiative chamber. This cooling cycle is repeated so that an efficient cooling operation can be realized in the cooling module. Arrangement of the endoergic, radiative and circulation pump chambers along the thermal conductive member leads to a minimized height of the cooling module.

13 Claims, 3 Drawing Sheets

COOLING MODULE

BACKGROUND OF THE INVENTION

1. Field of the Invention

The present invention relates to a cooling module comprising an endoergic chamber designed to transfer thermal energy to a coolant, and a radiative chamber connected to the endoergic chamber so as to absorb the thermal energy from the coolant.

2. Description of the Prior Art

A cooling module often includes radiation fins. The cooling module of the type usually includes a thermal conductive plate contacting a heat generating object such as a large-scale integrated circuit (LSI) chip, as disclosed in Japanese Patent Application Publication No. 8-32263. The radiation fins are fixed to the thermal conductive plate. The thermal energy of the LSI chip is transferred to the coolant through the thermal conductive plate. The coolant flows within the radiation fins. The thermal energy of the LSI chip is in this manner transferred to the radiation fins. The thermal energy of the coolant is then radiated into the air through the radiation fins.

The aforementioned publication discloses the radiation fins standing from the thermal conductive plate in the cooling device. Unless the radiation fins are formed sufficiently higher, a efficient radiation of heat cannot be achieved. A larger space is required above the LSI chip, for example. In addition, a flow passage of the coolant must be formed within the individual one of the radiation fins in the cooling module of the type. The production of the cooling module gets complicated. This leads to an increased production cost.

SUMMARY OF THE INVENTION

It is accordingly an object of the present invention to provide a cooling module contributing to a reduced space required above a target object and to an efficient cooling of the target object.

According to a first aspect of the present invention, there is provided a cooling module comprising: a thermal conductive member at least partly having a thermal conductivity; an endoergic chamber defined along the thermal conductive member and designed to transfer thermal energy to a coolant; a radiative chamber defined along the thermal conductive member off the endoergic chamber and designed to absorb thermal energy from the coolant; a circulation pump chamber defined along the thermal conductive chamber off the endoergic chamber; and a circulation pump placed within the circulation pump chamber and designed to circulate the coolant through the endoergic and radiative chambers.

A circulation channel is established through the endoergic, radiative and circulation pump chambers in the cooling module. A closed circulation channel can be established. When the circulation pump operates, the coolant circulate through the endoergic, radiative and circulation pump chambers in this sequence. The coolant absorbs thermal energy from the thermal conductive member in the endoergic chamber. The coolant is then allowed to flow along the thermal conductive member into the radiative chamber. The thermal energy of the coolant is taken away in the radiative chamber. The coolant gets cooled. The cooled coolant is led to the endoergic chamber through the circulation pump chamber. This cooling cycle is repeated so that an efficient cooling operation can be realized in the cooling module.

In addition, the cooling module enables arrangement of the endoergic, radiative and circulation pump chambers along the thermal conductive member. The height of the cooling module can be minimized. The cooling module requires only a smaller space on a target object.

The cooling module may further comprise an auxiliary member opposed to the thermal conductive member between the endoergic and radiative chambers, for example. The auxiliary member thus serves to define a flow passage for bringing the coolant to the radiative chamber from the endoergic chamber. The flow passage connects the endoergic chamber to the radiative chamber. Leakage of the coolant is reliably prevented in the cooling module as compared with the case where piping is employed to connect the endoergic chamber to the radiative chamber. The cooling module is allowed to have an improved durability and reliability.

The cooling module may further comprise a reservoir defined along the thermal conductive member off the radiative chamber. The reservoir is designed to reserve the coolant discharged from the radiative chamber. This enables arrangement of the endoergic chamber, the radiative chamber, the reservoir and the circulation pump chamber along the thermal conductive member. The height of the cooling module can be minimized.

A partition may be placed between the radiative chamber and the reservoir so as to isolate the radiative chamber from the reservoir. The reservoir can be formed in a facilitated manner. Moreover, the break of the partition can be utilized to connect the radiative chamber to the reservoir. Leakage of the coolant can reliably be prevented in the cooling module as compared with the case where piping is employed to connect the radiative chamber to the reservoir.

Likewise, a partition may be placed between the reservoir and the circulation pump chamber so as to isolate the reservoir from the circulation pump chamber. The reservoir can be formed in a facilitated manner. Moreover, the break of the partition can be utilized to connect the reservoir to the circulation pump chamber. Leakage of the coolant can reliably be prevented in the cooling module as compared with the case where piping is employed to connect the reservoir to the circulation pump chamber.

The cooling module may further comprise: a first fin standing from the outer wall surface of the endoergic chamber; a second fin standing from the outer wall surface of the radiative chamber; and a ventilation fan placed within a space adjacent the first and second fins. The first fin serves to absorb the thermal energy from the coolant within the endoergic chamber. The second fin likewise serves to absorb the thermal energy from the coolant within the radiative chamber. The cooling of the coolant can be promoted in this manner. Moreover, air is introduced into the first and second fins from the ventilation fan. The first and second fins are allowed to realize an efficient radiation of heat.

According to a second aspect of the present invention, there is provided a cooling module comprising: a plate-shaped upper thermal conductive member; a plate-shaped lower thermal conductive member opposed to the upper thermal conductive member; an endoergic chamber defined between the upper and lower thermal conductive members and designed to transfer thermal energy to a coolant; and a radiative chamber defined between the upper and lower thermal conductive members at a location off the endoergic chamber and designed to absorb thermal energy from the coolant.

A circulation channel is established through the endoergic and radiative chambers in the cooling module. A closed circulation channel can be established. When the coolant circulates through the endoergic and radiative chambers, the coolant serves to transfer the thermal energy from the endoergic chamber to the radiative chamber. The thermal energy is radiated from the radiative chamber into the air. This cooling cycle is repeated so that an efficient cooling operation can be realized in the cooling module.

The cooling module enables establishment of the endoergic and radiative chambers between the plate-shaped upper and lower thermal conductive plates. The endoergic and radiative chambers can be included within a flat space. The height of the cooling module can be minimized.

The upper and lower thermal conductive members may cooperate to define between the radiative and endoergic chambers a flow passage for bringing the coolant to the radiative chamber from the endoergic chamber. The flow passage connects the endoergic chamber to the radiative chamber. Leakage of the coolant can reliably be prevented in the cooling module as compared with the case where piping is employed to connect the endoergic chamber to the radiative chamber. The cooling module is allowed to have an improved durability and reliability.

The cooling module may further comprise: a plate-shaped auxiliary member opposed to the upper surface of the upper thermal conductive member so as to define an airflow passage outside the endoergic and radiative chambers; a first fin standing from the upper surface of the upper thermal conductive member outside the endoergic chamber; and a second fin standing from the upper surface of the upper thermal conductive member outside the radiative chamber. The first and second fins serve to promote the cooling of the coolant in the same manner as described above. Here, a ventilation fan may be placed within the airflow passage. The ventilation fan serves to bring air into the first and second fins. This still promotes the cooling of the coolant.

The auxiliary member and lower thermal conductive member may cooperate to define a reservoir designed to reserve the coolant discharged from the radiative chamber. The reservoir is defined between the plate-shaped upper and lower thermal conductive members in the same manner as described above. The reservoir can be included within a flat space. The height of the cooing module can be minimized. The cooling module requires only a smaller space on a target object.

Otherwise, the auxiliary member and lower thermal conductive member may cooperate to define a circulation pump chamber designed to receive the coolant discharged from the reservoir. The circulation pump chamber is defined between the plate-shaped upper and lower thermal conductive members in the same manner as described above. The circulation pump chamber can be included within a flat space. The height of the cooing module can be minimized. A circulation pump may be placed within the circulation pump chamber so as to discharge the coolant to the endoergic chamber.

According to a third aspect of the present invention, there is provided a cooling module comprising: an endoergic chamber defined at least partly with a wall exposed to a first passage, said endoergic chamber designed to transfer thermal energy to a coolant; a radiative chamber defined at least partly with a wall exposed to a second passage, said radiative chamber designed to absorb thermal energy from the coolant; and a ventilation fan placed within a space connecting the first passage to the second passage.

The cooling module enables airflow from the ventilation fan to flow along the wall of the endoergic chamber in the first passage. The cooling module also enables airflow from the ventilation fan to flow along the wall of the radiative chamber in the second passage. The thermal energy is efficiently taken away from the coolant within the endoergic and radiative chambers. The airflow from the single ventilation fan is in this manner efficiently utilized in the cooling of the coolant.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
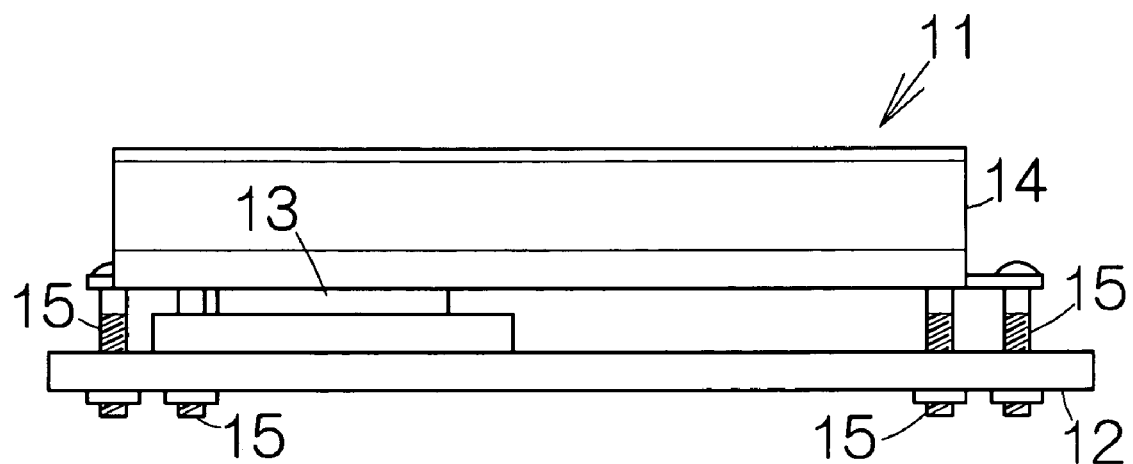
FIG. 1 is a side view schematically illustrating the structure of a printed circuit board unit.

FIG. 1 illustrates a schematic view of a printed circuit board unit 11. The printed circuit board unit 11 includes a printed circuit board 12 and a central processing unit (CPU) 13 mounted on the printed circuit board 12, for example. The CPU 13 is allowed to operate based on software programs temporarily stored in a memory, not shown, for example. The CPU 13 generates heat during the operation. A cooling module 14 is placed on the CPU 13. The cooling module 14 serves to cool the CPU 13. Screws 15 may be employed to couple the cooling module 14 to the printed circuit board 12.

Figure 2:
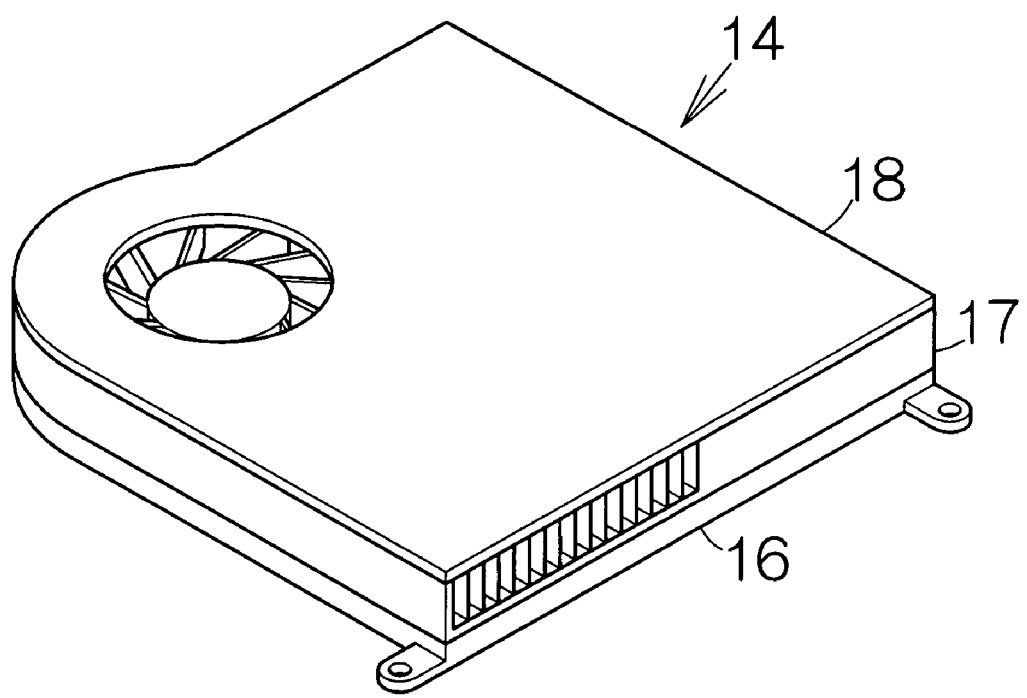
FIG. 2 is a perspective view schematically illustrating a cooling module in the printed circuit board unit.

As shown in FIG. 2, the cooling module 14 includes a first housing 16. A second housing 17 is placed on the first housing 16. A cover 18 is placed on the second housing 17.

Figure 3:
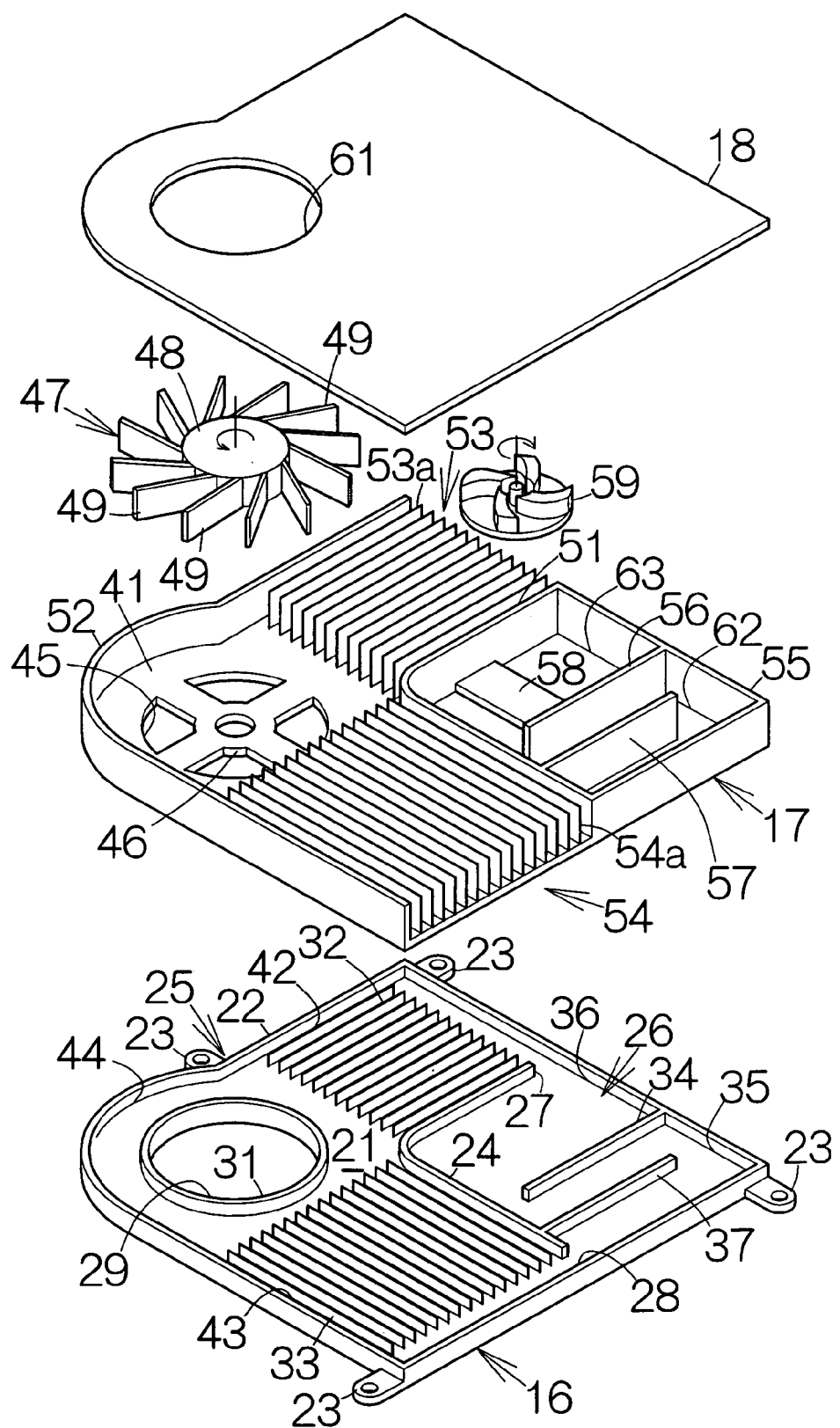
FIG. 3 is an exploded view of the cooling module.

As shown in FIG. 3, the first housing 16 includes a lower thermal conductive plate 21 defining a plane. A peripheral wall 22 is formed along the outer periphery of the lower thermal conductive plate 21. The peripheral wall 22 stands from the upper surface of the lower thermal conductive plate 21. The peripheral wall 22 endlessly extends without a gap. Tabs 23 are formed at the outer periphery of the lower thermal conductive plate 21. The tabs 23 protrude from the outer periphery of the lower thermal conductive plate 21. A through hole is defined in the individual tab 23 for receiving the insertion of the corresponding screw 15.

A partition 24 is formed on the upper surface of the lower thermal conductive plate 21. The partition 24 stands from the upper surface of the lower thermal conductive plate 21 inside the peripheral wall 22. The partition 24 serves to divide a space surrounded by the peripheral wall 22 into two spaces. This division achieves the establishment of first and second divisional spaces 25, 26 inside the peripheral wall 22. A first connecting opening 27 is formed between one end of the partition 24 and the peripheral wall 22. The first connecting opening 27 serves to connect the first and second divisional spaces 25, 26 to each other. A second connecting opening 28 is likewise formed between the other end of the partition 24 and the peripheral wall 22. The second connecting opening 28 serves to connect the first and second divisional spaces 25, 26 to each other.

A circular opening 29 is formed in the lower thermal conductive plate 21 within the first divisional space 25. An inner peripheral wall 31 is formed around the opening 29. The inner peripheral wall 31 stands from the upper surface of the lower thermal conductive plate 21. The inner peripheral wall 31 continuously surrounds the opening 29 without a gap.

First upright walls 32 are formed on the lower thermal conductive plate 21 within the first divisional space 25. The first upright walls 32 stand from the upper surface of the lower thermal conductive plate 21. The individual first upright walls 32 extend from positions near the first connecting opening 27 toward the inner peripheral wall 31. A predetermined space is defined between the adjacent parallel first upright walls 32. Flow passages are thus formed between the adjacent first upright walls 32.

Second upright walls 33 are likewise formed on the lower thermal conductive plate 21 within the first divisional space 25. The second upright walls 33 stand from the upper surface of the lower thermal conductive plate 21. The individual second upright walls 33 extend from positions near the second connecting opening 28 toward the inner peripheral wall 31. A predetermined space is defined between the adjacent parallel second upright walls 33. Flow passages are thus formed between the adjacent second upright walls 33.

An auxiliary partition 34 is formed on the lower thermal conductive plate 21 within the second divisional space 26. The auxiliary partition 34 stands from the upper surface of the lower thermal conductive plate 21. The auxiliary partition 34 serves to divide the second divisional space 26 into two spaces. In this case, the auxiliary partition 34 extends from the peripheral wall 22 toward the partition 24. The second divisional space 26 is thus divided into a first small space 35 near the second connecting opening 28 and a second small space 36 near the first connecting opening 27. The first and second small spaces 35, 36 are connected to each other. A gap is defined between the end of the auxiliary partition 34 and the partition 24 so as to establish the connection between the first and second small spaces 35, 36.

Here, an upright wall 37 is formed on the lower thermal conductive plate 21 within the first small space 35. The upright wall 37 stands from the upper surface of the lower thermal conductive plate 21. The upright wall 37 serves to divide the first small space 35 into two spaces. The upright wall 37 extends in parallel with the auxiliary partition 34 from a position near the aforementioned other end of the partition 24 toward the peripheral wall 22 so as to realize the division of the first small space 35. This division establishes a first smaller space near the second connecting opening 28 and a second smaller space near the auxiliary partition 34. The first and second smaller spaces are connected to each other. A gap is defined between the end of the upright wall 37 and the peripheral wall 22 so as to establish the connection.

The second housing 17 includes a bottom plate or upper thermal conductive plate 41. The upper thermal conductive plate 41 serves as an auxiliary member according to the present invention. The upper thermal conductive plate 41 covers over the first divisional space 25. The upper thermal conductive plate 41 is thus opposed to the lower thermal conductive plate 21. The upper thermal conductive plate 41 contacts the upper ends of the peripheral wall 22, the inner peripheral wall 31 and the partition 24 along the first divisional space 25. The upper thermal conductive plate 41 may be brazed to the peripheral wall 22, the inner peripheral wall 31 and the partition 24. The first divisional space 25 is in this manner closed between the lower and upper thermal conductive plates 21, 41. A closed flow passage is established between the first and second connecting openings 27, 28. Here, an endoergic chamber 42 is defined between the peripheral wall 22 and the partition 24. The first upright walls 32 are contained within the endoergic chamber 42. A radiative chamber 43 is likewise defined between the peripheral wall 22 and the partition 24. The second upright walls 33 are contained within the radiative chamber 43. A flow passage 44 serves to connect the endoergic and radiative chambers 42, 43 to each other. The flow passage 44 extends around the inner peripheral wall 31. The tip or upper ends of the first and second upright walls 32, 33 may be brazed to the upper thermal conductive plate 41. The first and second upright walls 32, 33 serve to promote the transfer of thermal energy from the lower thermal conductive plate 21 to the upper thermal conductive plate 41.

A circular opening 45 is defined in the upper thermal conductive plate 41 at a location corresponding to the opening 29 of the lower thermal conductive plate 21. A support member 46 is disposed in the opening 45. The support member 46 may be integral to the upper thermal conductive plate 41. A ventilation fan 47 is attached to the support member 46. The ventilation fan 47 includes a rotary member 48 rotating around a rotation axis standing in the vertical direction from the upper thermal conductive plate 41. Blades 49 are fixed to the rotary member 48. The blades 49 are designed to extend in planes parallel to the rotation axis. When the rotary member 48 rotates, airflow is generated in the centrifugal direction of the rotation axis. The ventilation fan 47 serves to suck air from the openings 29, 45 during the rotation of the rotary member 48. Wires, not shown, are employed to supply electric power to the ventilation fan 47. The wires may extend outward from the second housing 17.

A first outer wall 51 is formed on the upper thermal conductive plate 41. The first outer wall 51 stands from the upper surface of the upper thermal conductive plate 41 at a location corresponding to the partition 24 of the lower thermal conductive plate 21. The first outer wall 51 extends along the contour of the second divisional space 26. A second outer wall 52 is likewise formed on the upper thermal conductive plate 41 along the contour of the first divisional space 25. The second outer wall 52 stands from the upper surface of the upper thermal conductive plate 41 at a location corresponding to the peripheral wall 22 of the lower thermal conductive plate 41. The second outer wall 52 extends in parallel with the first outer wall 51. The ventilation fan 47 is placed within a space between the first and second outer walls 51, 52.

A first radiation fin set 53 is mounted on the upper surface of the upper thermal conductive plate 41 along the endoergic chamber 42. The first radiation fin set 53 includes radiation fins 53a each extending in parallel with the first and second outer walls 51, 52. A predetermined space is set between the adjacent radiation fins 53a in the first radiation fin set 53. Airflow passages are in this manner formed between the adjacent radiation fins 53a in the first radiation fin set 53. A second radiation fin set 54 is likewise mounted on the upper surface of the upper thermal conductive plate 41 along the radiative chamber 43. The second radiation fin set 54 includes radiation fins 54a each extending in parallel with the first and second outer walls 51, 52. A predetermined space is set between the adjacent radiation fins 54a in the second radiation fin set 54. Airflow passages are in this manner formed between the adjacent radiation fins 54a in the second radiation fin set 54. When the ventilation fan 47 rotates, airflow is generated along the airflow passages in the first and second radiation fin set 53, 54.

A surrounding wall 55 is formed integral to the first outer wall 51. The surrounding wall 55 extends along the contour of the second divisional space 26. The surrounding wall 55 and the first outer wall 51 cooperate to surround a small space without a gap. The surrounding wall 55 stands from the peripheral wall 22 at a portion that extends along the second divisional space 26. The surrounding wall 55 may be brazed at the tip or upper end of the peripheral wall 22.

An auxiliary partition 56 is formed integral to the surrounding wall 55. The auxiliary partition 56 extends on the auxiliary partition 34. Specifically, the auxiliary partition 56 stands from the top or upper end of the auxiliary partition 34. The auxiliary partition 56 may be brazed to the auxiliary partition 34. An upright wall 57 is likewise formed integral to the first outer wall 51. The upright wall 57 extends on the upright wall 37. Specifically, the uptight wall 57 stands from the top or upper end of the upright wall 37. The upright wall 57 may be brazed to the upright wall 37.

A support member 58 is placed between the auxiliary partition 56 and the first outer wall 51. The support member 58 may be integral to the first outer wall 51 and the auxiliary partition 56. A liquid circulation pump 59 is attached to the support member 58. When the liquid circulation pump 59 rotates around the rotation axis in a liquid, flow of the liquid is induced based on the rotation. Wires, not shown, may be employed to supply the liquid circulation pump 59. The wires may extend outward from the second housing 17.

The cover 18 covers over the second housing 17. Since the contour of the cover 18 corresponds to that of the second housing 17, the cover 18 contacts the upper ends of the first and second outer walls 51, 52, the surrounding wall 55, the auxiliary partition 45 and the upright wall 57. The cover 18 may be brazed to the first and second outer walls 51, 52, the surrounding wall 55, the auxiliary partition 45 and the upright wall 57. An airflow passage is thus established between the cover 18 and the upper thermal conductive plate 41 within a space between the first and second outer walls 51, 52. The airflow passage contains the aforementioned first and second radiation fin sets 53, 54. A circular opening 61 is formed in the cover 18 at a location corresponding to the openings 29, 45. The ventilation fan 47 serves to suck air from the opening 61 during the rotation.

A reservoir 62 and a circulation pump chamber 63 are defined between the cover 18 and the lower thermal conductive plate 21. The reservoir 62 and the circulation pump chamber 63 are surrounded by the partition 24, the first outer wall 51, the peripheral wall 22 and the surrounding wall 55. The auxiliary partitions 34, 56 serve to isolate the reservoir 62 from the circulation pump chamber 63. The reservoir 62 includes the aforementioned first small space 35. The circulation pump chamber 62 includes the aforementioned second small space 36. The reservoir 62 is connected to the radiative chamber 43 through the aforementioned second connecting opening 28. The circulation pump chamber 63 is connected to the endoergic chamber 42 through the aforementioned first connecting opening 27. The aforementioned liquid circulation pump 59 is placed within the circulation chamber 63.

Figure 4:
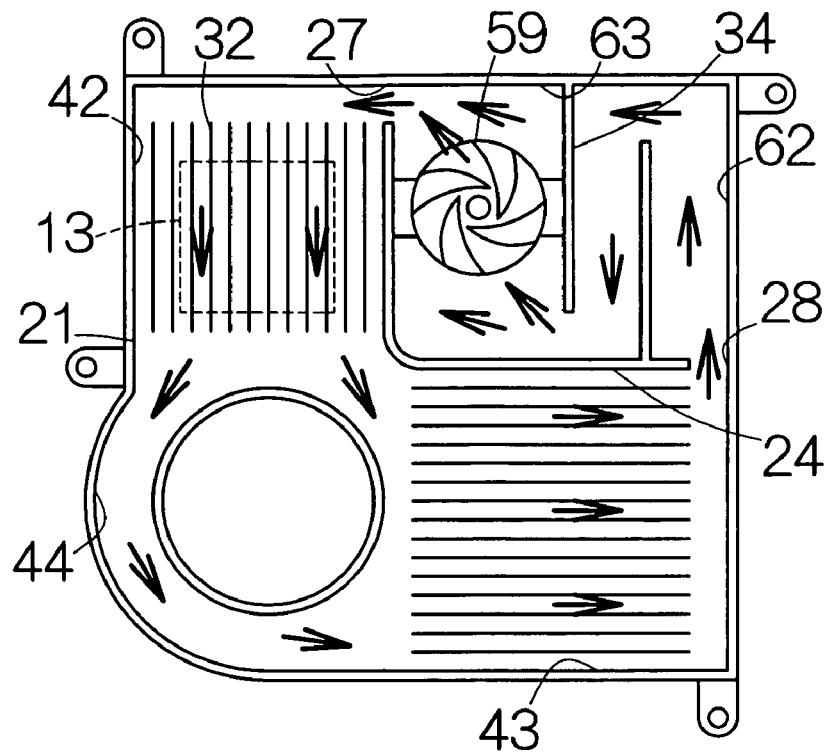
FIG. 4 is a plan view schematically illustrating the circulation of a coolant along a lower thermal conductive plate.

As shown in FIG. 4, a circulation channel is established along the lower thermal conductive plate 21 for a coolant or refrigerant in the cooling module 14. The circulation channel is closed between the lower and upper thermal conductive plates 21, 41 as well as between the lower thermal conductive plate 21 and the cover 18. When the liquid circulation pump 59 operates, the coolant such as water is forced to circulate in the circulation channel. The liquid circulation pump 59 serves to generate flow of the coolant from the reservoir 62 to the circulation pump chamber 63. The coolant discharged from the circulation pump chamber 63 is directed to the endoergic chamber 42 through the first connecting opening 27. The CPU 13 contacts the lower thermal conductive plate 21 outside the endoergic chamber 42. The thermal energy of the CPU 13 is thus transferred to the coolant within the endoergic chamber 42 through the lower thermal conductive plate 21. The coolant gets heated. In this case, the first upright walls 32 receive the thermal energy from the lower thermal conductive plate 21. The coolant is allowed to efficiently receive the thermal energy over a broader area in this manner. The transfer of the thermal energy is thus promoted. At the same time, the upper thermal conductive plate 41 receives the thermal energy from the first upright walls 32. The thermal energy is radiated from the upper thermal conductive plate 41 into the air.

The coolant flows into the flow passage 44 from the endoergic chamber 42. The thermal energy of the coolant is transferred to the lower and upper thermal conductive plates 21, 41 within the flow passage 44. The lower and upper thermal conductive plates 21, 41 serve to absorb the thermal energy of the coolant. The coolant then enters the radiative chamber 43. The thermal energy is efficiently taken away from the coolant through the second upright walls 33 over a broader area within the radiative chamber 43. The thermal energy is rapidly lost in this manner. The lower and upper thermal conductive plates 21, 41 serve to radiate the thermal energy into the air. The coolant is thus cooled. The cooled coolant is allowed to flow into the reservoir 62 through the second connecting opening 28.

The cooling module 14 enables arrangement of the endoergic chamber 42, the radiative chamber 43, the reservoir 62 and the circulation pump chamber 63 along the plane defined by the lower thermal conductive plate 21. The height of the cooling module 14 can be minimized. The cooling module 14 requires only a smaller space on the CPU 13. The cooling module 14 also enables the production of the first and second housings 16, 17 and the cover 18 based on metal plates, for example. In this case, pressing may be employed to form the first and second housings 16, 17 and the cover 18, respectively. It is thus possible to avoid complication of the production process. An increase in the production cost cannot be accompanied. The first and second upright walls 32, 33 and the first and second radiation fin sets 53, 54 may be brazed on the first and second housings 16, 17.

Moreover, the partition 24 and the auxiliary partitions 34, 56 serve to isolate the endoergic chamber 42, the radiative chamber 43, the reservoir 62 and the circulation pump chamber 63 from one another. On the other hand, the breaks of the partition 24 and the auxiliary partitions 34, 56 is utilized to connect the endoergic chamber 42, the radiative chamber 43, the reservoir 62 and the circulation pump chamber 63 to each other. Leakage of the coolant is reliably prevented in the cooling module 14 as compared with the case where piping is employed to connect the endoergic chamber, the radiative chamber, the reservoir and the circulation pump chamber to each other. The cooling module 14 is allowed to have an improved endurance and reliability.

Figure 5:
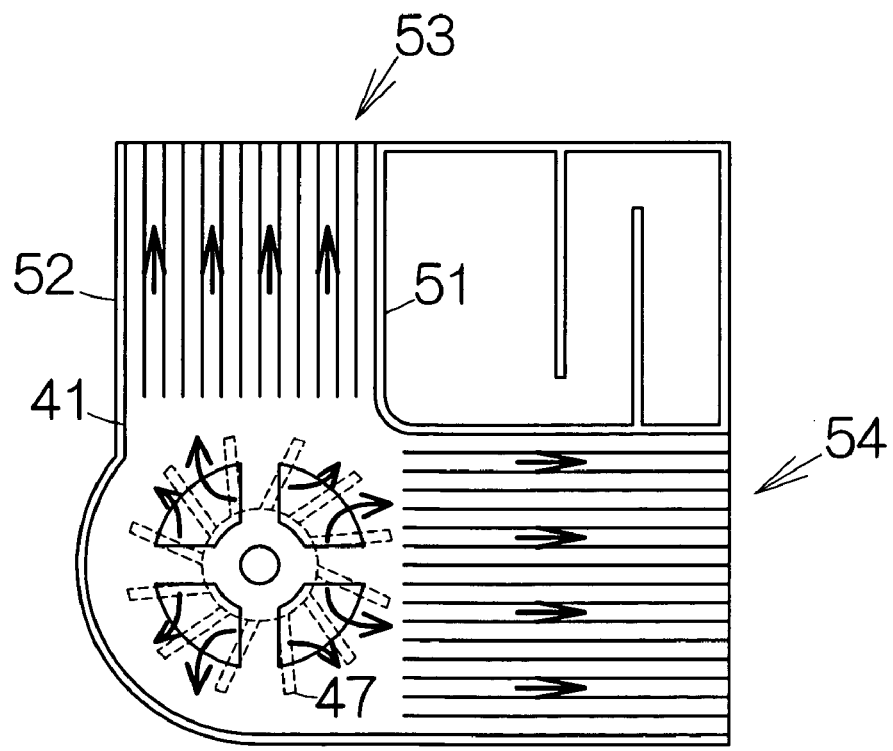
FIG. 5 is a plan view schematically illustrating airflow generated along the upper thermal conductive plate.

Furthermore, the cooling module 14 enables establishment of the airflow passage along the upper thermal conductive plate 41, as shown in FIG. 5, for example. The ventilation fan 47 induces the airflow in a first direction that reaches the first radiation fin set 53. The ventilation fan 47 also induces the airflow in a second direction different from the first direction so as to bring the airflow into the second radiation fin set 54. The single ventilation fan 47 allows the airflow to flow along the different directions. The airflow from the ventilation fan 47 is efficiently utilized in this manner. The airflow efficiently absorbs the thermal energy from the first and second radiation fin sets 53, 54. The thermal energy of the coolant is efficiently radiated into the air through the first and second radiation fin sets 53, 54 after it is transmitted to the first and second radiation fin sets 53, 54 from the upper thermal conductive plate 41. The cooling of the coolant is thus promoted.

It should be noted that the cooling module 14 may employ a compressor in place of the aforementioned liquid circulation pump 59. It depends upon the kind of the coolant or refrigerant.

What is claimed is:

1. A cooling module comprising:
   a thermal conductive member at least partly having a thermal conductivity;
   an endoergic chamber defined along a plane of the thermal conductive member, said endoergic chamber designed to transfer thermal energy to a coolant;
   a radiative chamber defined along the plane of the thermal conductive member off the endoergic chamber, said radiative chamber designed to absorb thermal energy from the coolant;
   a circulation pump chamber defined along the plane of the thermal conductive member off the endoergic chamber; and
   a circulation pump placed within the circulation pump chamber, said circulation pump designed to circulate the coolant through the endoergic and radiative chambers.

2. The cooling module according to claim 1, further comprising an auxiliary member opposed to the thermal conductive member between the endoergic and radiative chambers so as to define a flow passage for bringing the coolant to the radiative chamber from the endoergic chamber.

3. The cooling module according to claim 1, further comprising: a first fin standing from an outer wall surface of the endoergic chamber; a second fin standing from an outer wall surface of the radiative chamber; and a ventilation fan placed within a space adjacent the first and second fins.

4. The cooling module according to claim 1, wherein the endoergic chamber, the radiative chamber and the circulation pump chamber are defined directly on the plane of the thermal conductive member.

5. A cooling module comprising:
   a thermal conductive member at least partly having a thermal conductivity;
   an endoergic chamber defined along the thermal conductive member, said endoergic chamber designed to transfer thermal energy to a coolant;
   a radiative chamber defined along the thermal conductive member off the endoergic chamber, said radiative chamber designed to absorb thermal energy from the coolant;
   a circulation pump chamber defined along the thermal conductive member off the endoergic chamber;
   a circulation pump placed within the circulation pump chamber, said circulation pump designed to circulate the coolant through the endoergic and radiative chambers; and
   a reservoir defined along the thermal conductive member off the radiative chamber, said reservoir designed to reserve the coolant discharged from the radiative chamber.

6. The cooling module according to claim 5, further comprising a partition placed between the radiative chamber and the reservoir so as to isolate the radiative chamber from the reservoir.

7. The cooling module according to claim 5, further comprising a partition placed between the reservoir and the circulation pump chamber so as to isolate the reservoir from the circulation pump chamber.

8. A cooling module comprising:
   a plate-shaped upper thermal conductive member;
   a plate-shaped lower thermal conductive member opposed to the upper thermal conductive member;
   an endoergic chamber defined directly on a plane of the lower thermal conductive member, said endoergic chamber designed to transfer thermal energy to a coolant; and
   a radiative chamber defined directly on the plane of the lower thermal conductive member at a location off the endoergic chamber, said radiative chamber designed to absorb thermal energy from the coolant.

9. The cooling module according to claim 8, wherein said upper and lower thermal conductive members cooperate to define between the radiative and endoergic chambers a flow passage for bringing the coolant to the radiative chamber from the endoergic chamber.

10. A cooling module comprising:
    a plate-shaped upper thermal conductive member;
    a plate-shaped lower thermal conductive member opposed to the upper thermal conductive member;
    an endoergic chamber defined directly on the lower thermal conductive member, said endoergic chamber designed to transfer thermal energy to a coolant;
    a radiative chamber defined directly on the lower thermal conductive member at a location off the endoergic chamber, said radiative chamber designed to absorb thermal energy from the coolant;
    a plate-shaped auxiliary member opposed to an upper surface of the upper thermal conductive member so as to define an airflow passage outside the endoergic and radiative chambers;
    a first fin standing from the upper surface of the upper thermal conductive member outside the endoergic chamber; and
    a second fin standing from the upper surface of the upper thermal conductive member outside the radiative chamber.

11. The cooling module according to claim 10, wherein a ventilation fan is placed in the airflow passage.

12. A cooling module comprising:
    a plate-shaped upper thermal conductive member;
    a plate-shaped lower thermal conductive member opposed to the upper thermal conductive member;
    an endoergic chamber defined between the upper and lower thermal conductive members, said endoergic chamber designed to transfer thermal energy to a coolant;
    a radiative chamber defined between the upper and lower thermal conductive members at a location off the endoergic chamber, said radiative chamber designed to absorb thermal energy from the coolant;

a plate-shaped auxiliary member opposed to an upper surface of the upper thermal conductive member so as to define an airflow passage outside the endoergic and radiative chambers;

a first fin standing from the upper surface of the upper thermal conductive member outside the endoergic chamber; and a second fin standing from the upper surface of the upper thermal conductive member outside the radiative chamber, wherein said auxiliary member and lower thermal conductive member cooperate to define a reservoir designed to reserve the coolant discharged from the radiative chamber.

13. The cooling module according to claim 12, wherein said auxiliary member and lower thermal conductive member cooperate to define a circulation pump chamber designed to receive the coolant discharged from the reservoir, said circulation pump chamber containing a circulation pump designed to discharge the coolant to the endoergic chamber.

* * * * *